(12) United States Patent
Hatakeyama

(10) Patent No.: US 6,623,904 B2
(45) Date of Patent: Sep. 23, 2003

(54) PHOTOSENSITIVE TRANSFER RECORDING MATERIAL

(75) Inventor: Akira Hatakeyama, Shizuoka-ken (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/166,127

(22) Filed: Jun. 11, 2002

(65) Prior Publication Data

US 2003/0054266 A1 Mar. 20, 2003

(30) Foreign Application Priority Data

Jun. 13, 2001 (JP) ........................................ 2001-178738

(51) Int. Cl.$^7$ ................................................. G02B 5/20
(52) U.S. Cl. ..................... 430/260; 430/262; 430/263
(58) Field of Search ............................... 430/259, 262, 430/263, 260

(56) References Cited

U.S. PATENT DOCUMENTS 3,573,907 A * 4/1971 Verelst et al. ................ 430/258
5,294,516 A * 3/1994 Sato et al. .................... 430/262

* cited by examiner

Primary Examiner—John A. McPherson
(74) Attorney, Agent, or Firm—Sughrue Mion, PLLC

(57) ABSTRACT

A photosensitive transfer recording material includes a temporary support having sequentially disposed thereon a thermoplastic resin layer, an alkali-soluble intermediate layer, and an alkali-soluble pigment-containing photosensitive resin layer, with the intermediate layer containing a polymer latex. The glass transition temperature of the polymer latex is 60° C. or less. Also disclosed is a process for producing a color filter including the photosensitive transfer recording material.

13 Claims, No Drawings

PHOTOSENSITIVE TRANSFER RECORDING MATERIAL

BACKGROUND OF THE INVENTION

1. Field of the Invention

The present invention relates to a photosensitive transfer recording material. More specifically, it relates to a photosensitive transfer recording material appropriate for dry transfer onto an uneven support, and to a process for producing a color filter using the photosensitive transfer recording material.

2. Description of the Related Art

Photosensitive transfer recording materials that are used in the production of color filters for liquid crystal cells and that comprise a temporary support having successively disposed thereon a thermoplastic resin layer, an alkali-soluble intermediate layer, and an alkali-soluble, pigment-containing photosensitive resin layer are conventionally known. Such materials are disclosed in, for example, Japanese Patent Application Laid-open Publication (JP-A) Nos. 5-173320 and 11-149008. In these publications, a photosensitive resin layer of a photosensitive transfer recording material is adhered to a substrate by ordinary lamination, and then the temporary support is peeled away to form an image on the substrate without exposing and developing the substrate.

Conventionally, there has been the problem that, when the surface of the substrate is uneven, air bubbles come between the photosensitive resin layer and the substrate when the two are adhered, whereby defects in transfer are caused. However, it has become possible to obtain a good transfer image, even if the substrate is uneven, by disposing a thermoplastic resin layer to prevent the formation of air bubbles.

Nevertheless, air bubbles have again become easily formable due to an increase in the production rates of color filters in recent years and an attendant increase in the speed at which lamination is conducted. Thus, defects in transfer have again become a problem.

In order to prevent air bubbles from forming when lamination is conducted at high speed, it is necessary to soften the thermoplastic resin layer. However, softening the thermoplastic resin layer causes reticulation. Reticulation means that when the intermediate layer expands due to moisture absorption or the like, the soft thermoplastic resin buckles and fine wrinkles appear in the surface of the photosensitive transfer recording material, which results in defective transfer. What is needed in order to conduct lamination at high speed is a technique to prevent air bubbles and reticulation.

SUMMARY OF THE INVENTION

It is a first object of the present invention to provide a photosensitive transfer recording material that prevents both the formation of air bubbles and reticulation even when lamination is conducted at high speed. It is a second object of the invention to provide a process for producing a color filter using the photosensitive transfer recording material.

In order to achieve the first object, there is provided a photosensitive transfer recording material that includes a temporary support having sequentially disposed thereon a thermoplastic resin layer, an alkali-soluble intermediate layer, and an alkali-soluble pigment-containing photosensitive resin layer, with the intermediate layer containing a polymer latex.

The glass transition temperature (Tg) of the polymer latex is preferably 60° C. or less. Additionally, the amount of the polymer latex is, in terms of the solid content thereof, 5 to 70% by weight with respect to the resin of the intermediate layer.

In order to achieve the second object, there is also provided a process for producing a color filter using plural types of the photosensitive transfer recording material.

DETAILED DESCRIPTION OF THE INVENTION

Photosensitive Transfer Recording Material

A photosensitive transfer recording material of the present invention comprises a temporary support having sequentially disposed thereon a thermoplastic resin layer, an alkali-soluble intermediate layer, and an alkali-soluble pigment-containing photosensitive resin layer, with the intermediate layer containing a polymer latex. The photosensitive transfer recording material of the invention and a process for producing a color filter using the photosensitive transfer recording material are described below.

Alkali-solubility

By "alkali-soluble" is meant soluble in an aqueous solution of an alkaline substance, such as listed below, or soluble in an aqueous solution of an alkaline substance having mixed therein water and a water-miscible organic solvent.

Examples of the alkaline substance include alkali metal hydroxides (such as sodium hydroxide and potassium hydroxide), alkali metal carbonates (such as sodium carbonate and potassium carbonate), alkali metal bicarbonates (such as sodium bicarbonate and potassium bicarbonate), alkali metal silicates (such as sodium silicate and potassium silicate), alkali metal metasilicates (such as sodium metasilicate and potassium metasilicate), triethanolamine, diethanolamine, monoethanolamine, morpholine, tetraalkylammonium hydroxides (such as tetramethylammonium hydroxide) and sodium tertiary phosphate. It is preferable that the concentration of the alkaline substance is 0.01 to 30% by weight and that the pH is 8 to 14.

Examples of the water-miscible organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexane, $\epsilon$-caprolactone, $\gamma$-butyrolactone, dimethylformamide, dimethylacetamide, hexamethylphosphoramide, ethyl lactate, methyl lactate, $\epsilon$-caprolactam and N-methylpyrrolidone. The concentration of the water-miscible organic solvent is 0.1 to 30% by weight. Known surfactants can also be added. It is preferable that the concentration of the surfactant is 0.01 to 10% by weight.

Thermoplastic Resin Layer

Examples of the resin comprising the thermoplastic resin layer include an acrylic resin, a polystyrene resin, a polyester resin, a polyurethane resin, a rubber resin, a vinyl acetate resin, a polyolefin resin, and copolymers thereof. Although it is not essential for the resin comprising the thermoplastic resin layer of the invention to be alkali-soluble, the resin is preferably alkali-soluble.

Specific examples of the resin comprising the thermoplastic resin layer include at least one of a saponified product of an ethylene/acrylic ester copolymer, a saponified product of a styrene/(meth)acrylic ester copolymer, a styrene/(meth)acrylic acid/(meth)acrylic ester three-component copolymer, a saponified product of a vinyl toluene/(meth)acrylic ester copolymer, a poly(meth)acrylic ester, a saponified product of a butyl (meth)acrylate/(meth)acrylic ester (such as vinyl acetate) copolymer, and the alkaline aqueous solution-soluble organic polymers described in *Purasuchikku seinô binran ("Manual of Plastics Properties") (compiled by the Japan Plastics Industry Federation and Zen-Nihon Purasuchikku Seikei Kôgyô Rengôkai, Tokyo: Kôgyô Chôsakai, 1968)*.

It is preferably that these resins are used in combination.

In particular, resins having a weight average molecular weight of 50,000 to 500,000 and a glass transition temperature (Tg) of 0 to 140° C. (hereinafter, also referred to as resin (A)) are preferable. Resins having a weight average molecular weight of 60,000 to 200,000 and a glass transition temperature (Tg) of 30 to 110° C. are more preferable. Specific examples of these resins include the alkaline aqueous solution-soluble resins described in Japanese Patent Application Publication (JP-B) Nos. 54-34327, 55-38961, 58-12577 and 54-25957, JP-A No. 61-134756, JP-B No. 59-44615, JP-A Nos. 54-92723,54-99418, 54-137085, 57-20732, 58-93046, 59-97135 and 60-159743, Offenlegungsschrift (OLS) No. 3504254, JP-A Nos. 60-247638, 60-208748, 60-214354, 60-230135, 60-258539, 61-169829, 61-213213, 63-147159, 63-213837, 63-266448, 64-55551, 64-55550, 2-191955, 2-199403, 2-199404and 2-208602, and Japanese Patent Application No. 4-39653. Especially preferable is the methacrylic acid/2-ethylhexyl acrylate/ benzyl methacrylate/methyl methacrylate copolymer described in JP-A No. 63-147159.

Moreover, resins having a weight average molecular weight of 3,000 to 30,000 and a glass transition temperature (Tg) of 30 to 170° C. (hereinafter, also referred to as resin (B)) are preferable. Further, resins having a weight average molecular weight of 4,000 to 20,000 and a glass transition temperature (Tg) of 60 to 140° C. are more preferable. Preferable examples thereof include the resins described in the foregoing documents. Especially preferable is the styrene/(meth)acrylic acid copolymer described in JP-B No. 55-38961 and JP-A No. 5-241340.

When resin (A) comprising the thermoplastic resin layer has a weight average molecular weight of less than 50,000 or a glass transition temperature (Tg) lower than 0° C., reticulation occurs and the thermoplastic resin bleeds out during transfer and contaminates a permanent support. When resin (A) has a weight average molecular weight of more than 500,000 or a glass transition temperature (Tg) higher than 140° C., air bubbles enter between pixels during transfer and it becomes difficult to remove the alkaline aqueous solution of the thermoplastic resin.

When resin (B) constituting the thermoplastic resin layer has a weight average molecular weight of less than 3,000 or a glass transition temperature (Tg) lower than 30° C., reticulation occurs and the thermoplastic resin bleeds out during transfer and contaminates the permanent support. When resin (B) has a weight average molecular weight of more than 30,000 or a glass transition temperature (Tg) higher than 170° C., bubbles enter between pixels during transfer and it becomes difficult to remove the alkaline aqueous solution of the thermoplastic resin.

When resins (A) and (B) are mixed and used in combination, the mixing ratio of resin (A) is preferably 95 to 5% by weight. When the ratio of resin (A) exceeds 95%, bubbles are liable to enter between pixels during transfer. When the ratio of resin (A) is less than 5%, the thermoplastic resin bleeds out, or the thermoplastic resin layer becomes brittle and it becomes easy for fine chips to be scattered during cutting.

The glass transition temperature (Tg) of the thermoplastic resin layer can be finely adjusted by adding, to these organic polymers, various polymers, a supercooling substance, an adhesion modifier, a surfactant and a release agent for adjusting adhesion with a temporary support and/or transferability. Preferable examples of the plasticizer include polypropylene glycol, polyethylene glycol, dioctyl phthalate, diheptyl phthalate, dibutyl phthalate, tricresyl phosphate, cresyldiphenyl phosphate biphenyldiphenyl phosphate, polyethylene glycol mono(meth)acrylate, polyethylene glycol di(meth)acrylate, polypropylene glycol mono(meth)acrylate, polypropylene glycol di(meth) acrylate, an addition reaction product of an epoxy resin and polyethylene glycol mono(meth)acrylate, an addition reaction product of an organic diisocyanate and polyethylene glycol mono(meth)acrylate, an addition reaction product of an organic diisocyanate and polypropylene glycol mono (meth)acrylate and a condensation reaction product of bisphenol A and polyethylene glycol mono(meth)acrylate. The amount of the plasticizer is preferably 0 to 200% by weight, and more preferably 20 to 100% by weight, based on the total amount of resins (A) and (B) comprising the thermoplastic resin layer.

The thickness of the thermoplastic resin layer is preferably 6 μm or more. The reason is because, when the thickness of the thermoplastic resin layer is less than 6 μm, it becomes impossible to completely absorb unevenness of an undercoat having a thickness of 1 μm or more. Further, the upper limit is approximately 100 μm or less, and preferably approximately 50 μm or less, in view of removing the alkaline aqueous solution and productivity.

A coating solution of the thermoplastic resin layer in the invention is not particularly limited as long as it dissolves the resin comprising this layer. Examples thereof include methyl ethyl ketone, n-propanol and i-propanol.

Alkali-soluble Intermediate Layer

The resin constituting the intermediate layer is not particularly limited so long as it has the foregoing alkali solubility. Examples of the resin include a polyvinyl alcohol resin, a polyvinyl pyrrolidone resin, a cellulose resin, an acrylamide resin, a polyethylene oxide resin, gelatin, a vinyl ether resin, a polyamide resin, and copolymers thereof. Further, a resin formed by copolymerizing a resin, such as a polyester that is ordinarily alkali-insoluble, with a monomer having a carboxyl group or a sulfonic group to make the resin alkali-soluble may also be used.

Of these resins, a polyvinyl alcohol resin is preferable, and the degree of saponification thereof is preferably 80% or more, and more preferably 83 to 98%.

It is preferable that the resin comprising the intermediate layer is formed by mixing two or more types of resins. It is particularly preferable that the resin is formed by mixing polyvinyl alcohol and polyvinyl pyrrolidone. The polyvinyl pyrrolidone/polyvinyl alcohol weight ratio is preferably 1/99 to 75/25, and more preferably 10/90 to 50/50. When this ratio is less than 1/99, there are problems in that surface conditions of the intermediate layer are compromised and adhesion between the intermediate layer and the photosensitive resin layer formed thereon is poor. When the ratio exceeds 75/25, the ability of the intermediate layer to block oxygen is reduced, whereby sensitivity is reduced.

Additives such as surfactants may be added to the intermediate layer as required.

The thickness of the intermediate layer is preferably 0.1 to 5 μm, and more preferably 0.5 to 3 μm. When the thickness is less than 0.1 μm, the ability of the intermediate layer to block oxygen is reduced. When it is more than 5 μm, it takes longer for the intermediate layer to be removed during development.

The coating solvent of the intermediate layer is not particularly limited as long as it dissolves the resin. Water is preferable. A solvent created by mixing water and the foregoing water-miscible organic solvent is also preferable. Preferable examples of the solvent include water, water/methanol (weight ratio=90/10), water/methanol (weight ratio=70/30), water/methanol (weight ratio=55/45), water/ethanol (weight ratio=70/30), water/1-propanol (weight ratio=70/30), water/acetone (weight ratio=90/10), and water/methyl ethyl ketone (weight ratio=95/5).

Polymer Latex

Polymer latex is added to the intermediate layer of the invention. The polymer latex referred to herein is a dispersion in which fine particles of the water-insoluble polymer are dispersed in water. Examples of such polymer latex are described in, for example, Shôichi Muroi's Kôbunshi ratekkusu no kagaku ("Chemistry of Polymer Latex") (Tokyo: Kôbunshi Kankôkai, 1973). As the polymer latex used in the invention, polymer latexes made of an acrylic polymer, a vinyl acetate polymer, a rubber (for example, styrene-butadiene or chloroprene) polymer, an olefin polymer, a polyester polymer, a polyurethane polymer, a polystyrene polymer, and copolymers thereof are preferable.

The glass transition temperature (Tg) of the polymer latex is preferably 60° C. or less, and more preferably 45° C. or less. When the Tg exceeds 60° C., it becomes difficult to prevent reticulation. Preferable examples of the polymer latex include an ethyl acrylate latex (average particle diameter=0.2 $\mu$m), an ethyl acrylate/acrylic acid latex (weight ratio=98/2, average particle diameter=0.2 $\mu$m), a methyl methacrylate/ethyl acrylate/acrylic acid latex (weight ratio=5/40/5, average particle diameter=0.15 $\mu$m), a methyl methacrylate/ethyl acrylate/acrylic acid latex (weight ratio=65/30/5, average particle diameter=0.19 $\mu$m), a methyl methacrylate/ethyl acrylate/acrylic acid latex (weight ratio=75/20/5, average particle diameter=0.15 $\mu$m), a methyl methacrylate/ethyl acrylate/acrylic acid latex (weight ratio=30/65/5, average particle diameter=0.15 $\mu$m), a methyl methacrylate/2-ethylhexyl acrylate/methacrylic acid latex (weight ratio=50/47/3, average particle diameter= 0.15 $\mu$m) and a styrene/butadiene/acrylic acid latex (weight ratio=40/58/2, average particle diameter=0.15 $\mu$m).

The amount of the polymer latex is preferably 5 to 70% by weight, more preferably 10 to 50% by weight, especially preferably 20 to 40% by weight, in terms of the solid content of the polymer latex, with respect to the resin comprising the intermediate layer. When the amount is less than 5% by weight, it becomes difficult to prevent reticulation. When the amount exceeds 70% by weight, surface conditions of the intermediate layer are compromised.

Photosensitive Resin Layer

Known photopolymerizable compositions can be used as the resin comprising the photosensitive resin layer of the invention. Preferable examples thereof are described in Japanese Patent Application No. 2-82262. The resin referred to herein may also be a resin formed by a monomer or an oligomer that is polymerized after exposure.

The photosensitive resin layer of the invention can contain a pigment other than the resin. Types and sizes of preferable pigments are described in, for example, JP-A No. 11-149008.

The photosensitive resin layer of the invention may include, as required, additives such as surfactants. Further, the coating solution of the thermoplastic resin layer of the invention is not particularly limited as long as it dissolves the resin constituting this layer. Examples thereof include methyl ethyl ketone, n-propanol and i-propanol.

It is preferable that a thin coating sheet for protecting the photosensitive resin layer from contamination or damage during storage is formed on the photosensitive resin layer. The coating sheet may be formed of a material that is the same as or similar to the material of the temporary support, provided that it can easily be separated from the photosensitive resin layer. Examples of the material for the coating sheet include a silicone sheet or a polyolefin or polytetrafluoroethylene sheet. The thickness of the coating sheet is preferably approximately 5 to 100 $\mu$m. A polyethylene or polypropylene film having a thickness of 10 to 30 $\mu$m is especially preferable.

Temporary Support

Known supports made of polyester, polystyrene or the like can be used as the temporary support of the invention. A biaxially oriented polyethylene terephthalate support is preferable in view of costs, heat resistance and dimensional stability. The thickness of the temporary support is preferably 15 to 200 $\mu$m, and more preferably 30 to 150 $\mu$m. When the thickness is less than 15 $\mu$m, wrinkles are generated by heat during lamination. When the thickness exceeds 200 $\mu$m, costs escalate.

Moreover, the electroconductive layer described in JP-A No. 11-149008 may be formed on the temporary support as required.

Image Forming Method

An image forming method using the photosensitive transfer recording material of the invention is described below.

First, the coating sheet of the photosensitive transfer recording material is removed, and the photosensitive resin layer is adhered to the support by pressing and heating. A known laminator or vacuum laminator can be used to accomplish the adhesion. In order to increase productivity, an autocut laminator can also be used. After the temporary support is peeled off, the photosensitive resin layer is exposed through a predetermined mask, the thermoplastic resin layer and the intermediate layer, and then removed. The photosensitive resin layer can be removed by, for example, dipping the same in a solvent or an aqueous developing solution (especially in an alkaline aqueous solution), spraying the photosensitive resin layer with a processing solution through a spray, rubbing the photosensitive resin layer with a brush, or by processing while applying ultrasonic waves.

A multicolor image can be formed by repeating this process several times using a photosensitive transfer recording material that includes several photosensitive resin layers of mutually different hues.

The photosensitive transfer recording material of the invention is mainly used in the production of color filters for liquid crystal displays, in the production of protecting layers in color filters, in the formation of multicolor images, and in the production of printed circuit boards.

When the photosensitive transfer recording material is used in the production of printed circuit boards, a known copper-clad laminate is used as the substrate. When the photosensitive transfer recording material is used in the production of color filters, a known glass plate or a soda glass plate having a silicon oxide film on the surface is used as the substrate.

When the invention is used in the production of printed circuit boards or color filters, air bubbles are not incorporated into the surroundings of prior pixels even if lamination is conducted at high speed, nor do deviations in lamination occur. Further, the film does not expand during coating. Accordingly, a printed circuit board or a color filter having fine surface conditions is obtained.

EXAMPLES

The invention is illustrated more specifically below by way of Examples. However, the invention is not limited thereto.

Example 1

Formation of Photosensitive Transfer Recording Material
Preparation of Thermoplastic Resin Layer

| | |
|---|---|
| methyl methacrylate/2-ethylhexyl acrylate/benzyl methacrylate/methacrylic acid copolymer (molar ratio = 55/30/10/5, weight average molecular weight = 100,000) | 60 g |
| styrene/acrylic acid copolymer (molar ratio = 65/35, weight average molecular weight = 10,000) | 140 g |
| compound obtained by dehydrocondensation of bisphenol A and 2 equivalents of octaethylene glycol monomethacrylate (trade name: BPE-500, made by Shin-Nakamura Kagaku K.K.) | 150 g |
| fluorine-based surfactant (trade name: MEGAFAC F176PF, made by Dainippon Ink And Chemicals, Inc.) | 1 g |
| methyl ethyl ketone | 699 g |

The above were mixed to form a thermoplastic resin layer coating solution.

Formation of Thermoplastic Resin Layer

The thermoplastic resin layer coating solution was coated on one surface of a biaxially oriented polyethylene terephthalate temporary support having a thickness of 75 μm, and then dried at 100° C. for 2 minutes to form a thermoplastic resin layer having a thickness of 15 μm.

Preparation of Intermediate Layer Coating Solution

| | |
|---|---|
| polyvinyl alcohol (trade name: PVA 205, made by Kuraray Co., Ltd., degree of saponification = 80%) | 30 g |
| polyvinyl pyrrolidone (trade name: PVP-K90, made by GAF Corporation) | 15 g |
| distilled water such that a total amount reached 1,000 g | added |
| ethyl acrylate latex (hereinafter referred to as Lx-1, average particle diameter = 0.2 μm, solid content = 20% by weight, glass transition temperature = −24° C.) (10% of the total solid content of the intermediate layer) | 25.0 g |
| methanol | 455 g |

The above were mixed to form an intermediate layer coating solution.

The intermediate layer coating solution was coated on the thermoplastic resin layer of the temporary support having coated thereon the thermoplastic resin layer, and then dried at 100° C. for 2 minutes to form a thermoplastic resin layer having a thickness of 2 μm.

Preparation of Photosensitive Resin Layer Coating Solution

Red, blue and green photosensitive resin layer coating solutions having the consitutions shown in Table 1, and a black photosensitive resin layer coating solution having the following constitution, were coated on the temporary support disposed with the thermoplastic resin layer and the intermediate layer, and dried at 100° C. for 2 minutes. The thickness of the red, blue and green photosensitive resin layers was 2.3 μm after drying, and the thickness of the black photosensitive resin layer was 1.6 μm after drying.

TABLE 1

| | Red | Green | Blue |
|---|---|---|---|
| Benzyl methacrylate/methacrylic acid copolymer (molar ratio = 73/27, molecular weight = 30,000) | 60 | 33.5 | 34.1 |
| Pentaerythritol hexaacrylate | 28.4 | 25.2 | 32.3 |
| Fluorine-based surfactant (MEGAFAC F177P, made by Dainippon Ink And Chemicals, Inc.) | 0.37 | 0.19 | 0.3 |
| 2,4-bis(trichloromethyl)-6-[4-(N,N-diethoxycarbonylmethyl]-8-triazine | 1.31 | 0 | 1.52 |
| 2-trichloromethyl-5-(p-styrylstyryl)-1,3,4-oxadiazole | 0 | 1.2 | 0 |
| Phenothiazine | 0.02 | 0.02 | 0.026 |
| Chromostal red A2B (red) | 27 | 0 | 0 |
| Valeotol yellow L1820 | 10.3 | 23 | 0 |
| Helioken blue L6700F (blue) | 0 | 0 | 25.6 |
| Monastral green (green) | 0 | 23 | 0 |
| Methoxypropylene glycol acetate | 310 | 310 | 310 |
| Methyl ethyl ketone | 460 | 460 | 460 |

* All units indicate parts by weight.

The composition of the light-shielding black photosensitive resin layer coating solution was as follows.

| | |
|---|---|
| benzyl methacrylate/methacrylic acid copolymer (molar ratio = 70/30, acid value = 104 mgKOH/g, weight average molecular weight = 30,000) | 21.0 parts by weight |
| 2-ethylhexyl acrylate/methacrylic acid/methyl methacrylate/benzyl methacrylate copolymer (molar ratio = 7/15/73/5, acid value = 77 mgKOH/g, weight average molecular weight = 80,000) | 14.7 parts by weight |
| dipentaerythritol hexaacrylate | 26.8 parts by weight |
| 2,4-bis(trichloromethyl)-6-[4-(N,N-diethoxycarbomethyl)-3-bromophenyl]-s-triazine | 1.32 parts by weight |
| carbon black | 27.0 parts by weight |
| pigment blue 15:6 | 5.70 parts by weight |
| pigment violet 23 | 3.57 parts by weight |
| hydroquinone monomethyl ether | 0.02 part by weight |
| surfactant (trade name: F117P, made by Dainippon Ink And Chemicals, Inc.) | 0.09 part by weight |
| propylene glycol monomethyl ether acetate | 400 parts by weight |
| methyl ethyl ketone | 600 parts by weight |

Formation of Photosensitive Transfer Recording Material

A polypropylene sheet having a thickness of 15 μm was overlaid on the resulting red, blue, green and black photosensitive resin layers, and pressed at room temperature to form a four-color photosensitive transfer recording material.

Evaluation of Occurrence of Air Bubbles

The photosensitive resin layer of the red photosensitive transfer recording material, from which the polypropylene sheet had been peeled off, and a glass support (thickness 1.1 mm) were overlaid such that they were opposite to each other, and laminated with a laminator (trade name: VP-11, manufactured by Osaka Laminator K.K.). Lamination was conducted at a temperature was 130° C., with a pressure of 10 kg/cm, and at a rate of 1.5 m/min. After the temporary support was peeled off, the layer was exposed through a predetermined photomask. The exposure was conducted with an ultrahigh pressure mercury lamp in an exposure dose of 100 mj/cm$^2$ by placing a glass filter (trade name: UVD36c, manufactured by Toshiba Corporation) between the light source and the sample to cut light having a wavelength of 400 nm. Subsequently, the thermoplastic resin layer and the intermediate layer were removed with a 1% triethanolamine aqueous solution, and an unexposed area of the photosensitive resin layer was then removed with a 1% sodium carbonate aqueous solution to form a red pixel pattern on the glass support. Thereafter, green and blue pixel patterns were formed thereon in the same manner successively using the green sample and the blue sample.

The glass support having the pixel patterns formed thereon and the photosensitive resin layer of the black photosensitive transfer recording material from which the polypropylene sheet had been peeled off were overlaid such that they were opposite to each other, and laminated with a laminator (trade name: VP-11, manufactured by Osaka Laminator K.K.). Lamination was conducted at a temperature was 130° C., with a pressure of 10 kg/cm, and at a rate of 1.5 m/min. The temporary support was then peeled off.

Subsequently, the light-shielding black photosensitive resin layer was exposed through the glass support using an ultrahigh pressure mercury lamp. At this time, a glass filter (trade name: UVD36c, manufactured by Toshiba Corporation) was placed between the light source and the sample to cut light having a wavelength of 400 nm or more. An exposure dose was 100 mj/cm$^2$. Thereafter, the thermoplastic resin layer was dissolved and removed with a predetermined alkaline aqueous solution (trade name: TPD, made by Fuji Photo Film Co., Ltd.), and the light-shielding black photosensitive resin layer was developed with an alkaline aqueous solution (trade name: TCD, made by Fuji Photo Film Co., Ltd.) to remove unexposed areas and form light-shielding films in spaces between red, green and blue pixels. It was identified that the removal of the unexposed area was conducted in film form at the time of development. The glass support with the pixels having the light-shielding films formed thereon was heated at 220° C. for 130 minutes to cure an area in which exposure on the upper portion of the light-shielding film was insufficient. In this manner, a color filter was produced. In the resulting color filter, overlapping of the light-shielding films and the red, green and blue layers was not observed, the Y value of the light-shielding films was 0.01, and the thickness of the light-shielding films was lower than the thickness of the red, green and blue pixels to provide a good flatness.

The color filter sample was produced in this manner. The number of air bubbles having a diameter of 100 μm or more among air bubbles in an area of 100 cm$^2$ of this sample was counted using a magnifier. In practical use, only a sample in which the number of bubbles having a diameter of 100 μm or more is 0/100 cm$^2$ of a sample is permissible.

Evaluation of Reticulation

A black sample from which the polypropylene sheet had been peeled off was stored in an atmosphere of 28° C. and 70% RH for 24 hours, and observed in this atmosphere using an optical microscope with 50× magnification to measure the degree of reticulation. The reticulation was evaluated according to the following grades. Permissible in practical use are grades ○ and ○Δ.

| | |
|---|---|
| No reticulation | ○ |
| Slight reticulation | ○Δ |
| Reticulation visible | Δ |
| Serious reticulation clearly visible | x |

The results are shown in Table 2.

Example 2

A photosensitive transfer recording material was produced and evaluated as in Example 1 except that the amount of the ethyl acrylate latex (Lx-1) in the intermediate layer coating solution was changed from 25.0 g to 56.25 g (20% of the total solid content of the intermediate layer). The results are shown in Table 2.

Example 3

A photosensitive transfer recording material was produced and evaluated as in Example 1 except that the amount of the ethyl acrylate latex (Lx-1) in the intermediate layer coating solution was changed from 25.0 g to 96.43 g (30% of the total solid content of the intermediate layer). The results are shown in Table 2.

Example 4

A photosensitive transfer recording material was produced and evaluated as in Example 3 except that 96.43 g (30% of the total solid content of the intermediate layer) of the following polymer latex was used instead of the ethyl acrylate latex (Lx-1) in the intermediate layer coating solution. The results are shown in Table 2.

ethyl acrylate/acrylic acid latex (hereinafter referred to as Lx-2, weight ratio=98/2, average particle diameter=0.2 μm, solid content=20% by weight, glass transition temperature=-22° C.)

Example 5

A photosensitive transfer recording material was produced and evaluated as in Example 3 except that 55.10 g (30% of the total solid content of the intermediate layer) of the following polymer latex was used instead of the ethyl acrylate latex in the intermediate layer coating solution. The results are shown in Table 2.

styrene/butadiene/acrylic acid latex (hereinafter referred to as Lx-3, weight ratio=40/58/2, average particle diameter=0.15 μm, solid content=35% by weight, glass transition temperature=-32° C.)

Example 6

A photosensitive transfer recording material was produced and evaluated as in Example 3 except that 77.14 g (30% of the total solid content of the intermediate layer) of the following polymer latex was used instead of the ethyl acrylate latex in the intermediate layer coating solution. The results are shown in Table 2.

methyl methacrylate/ethyl acrylate/acrylic acid latex (hereinafter referred to as Lx-4, weight ratio=55/40/5, average particle diameter=0.15 μm, solid content=25% by weight, glass transition temperature=40° C.)

Example 7

A photosensitive transfer recording material was produced and evaluated as in Example 3 except that 83.85 g (30% of the total solid content of the intermediate layer) of the following polymer latex was used instead of the ethyl acrylate latex in the intermediate layer coating solution. The results are shown in Table 2.

methyl methacrylate/ethyl acrylate/acrylic acid latex (hereinafter referred to as Lx-5, weight ratio=65/30/5, average particle diameter=0.19 μm, solid content=23% by weight, glass transition temperature 53° C.)

Example 8

A photosensitive transfer recording material was produced and evaluated as in Example 3 except that 87.66 g (30% of the total solid content of the intermediate layer) of the following polymer latex was used instead of the ethyl acrylate latex in the intermediate layer coating solution. The results are shown in Table 2.

methyl methacrylate/ethyl acrylate/acrylic acid latex (hereinafter referred to as Lx-6, weight ratio=75/20/5, average particle diameter=0.15 μm, solid content=22% by weight, glass transition temperature=69° C.)

Comparative Example 1

A photosensitive transfer recording material was produced and evaluated as in Example 3 except that the polymer latex was not added to the intermediate layer. The results are shown in Table 2.

Comparative Example 2

A photosensitive transfer recording material was produced and evaluated as in Comparative Example 1 except that in the thermoplastic resin layer, the amount of the compound obtained by dehydrocondensation of bisphenol A and 2 equivalents of octaethylene glycol monomethacrylate (trade name: BPE-500, made by Shin-Nakamura Kagaku K.K.) was changed to 99.4 g. The results are shown in Table 2.

Comparative Example 3

A photosensitive transfer recording material was produced and evaluated as in Comparative Example 1 except that in the thermoplastic resin layer, the amount of the compound obtained by dehydrocondensation of bisphenol A and 2 equivalents of octaethylene glycol monomethacrylate (trade name: BPE-500, made by Shin-Nakamura Kagaku K.K.) was changed to 49.7 g. The results are shown in Table 2.

TABLE 2

| | Ratio of BPE-500(%) | Type of latex | Glass transition temperature (° C.) | Amount of latex (wt. % based on the total solid content of an intermediate layer) | Number of bubbles (per 100 cm$^2$) | Reticulation |
|---|---|---|---|---|---|---|
| Ex. 1 | 42.7 | Lx-1 | −24 | 10 | 0 | ο∆ |
| Ex. 2 | 42.7 | Lx-1 | −24 | 20 | 0 | ο |
| Ex. 3 | 42.7 | Lx-1 | −24 | 30 | 0 | ο |
| Ex. 4 | 42.7 | Lx-2 | −22 | 30 | 0 | ο |
| Ex. 5 | 42.7 | Lx-3 | −32 | 30 | 0 | ο |
| Ex. 6 | 42.7 | Lx-4 | 40 | 30 | 0 | ο |
| Ex. 7 | 42.7 | Lx-5 | 53 | 30 | 0 | ο–ο∆ |
| Ex. 8 | 42.7 | Lx-6 | 69 | 30 | 0 | ο∆ |
| Comp. Ex. 1 | 42.7 | — | — | 0 | 0 | x |
| Comp. Ex. 2 | 19.9 | — | — | 0 | 2 | ∆ |
| Comp. Ex. 3 | 33.2 | — | — | 0 | 12 | ο |

*Ratio of BPE-500: volume ratio of BPE-500 in a thermoplastic resin

In the samples of Examples 1 to 8, no occurrences of air bubbles or reticulation were observed, and there was no coating unevenness or unevenness resulting from the lamination. Thus, a pattern having good image quality was obtained.

On the other hand, reticulation was observed in Comparative Example 1, and air bubbles were observed in Comparative Examples 2 and 3.

What is claimed is:

1. A photosensitive transfer recording material comprising a temporary support having sequentially disposed thereon:
    a thermoplastic resin layer;
    an alkali-soluble intermediate layer; and
    an alkali-soluble, pigment-containing photosensitive resin layer,
    wherein the intermediate layer contains a polymer latex.

2. The photosensitive transfer recording material according to claim 1, wherein the resin of the thermoplastic resin layer includes at least one of an acrylic resin, a polystyrene resin, a polyester resin, a polyurethane resin, a rubber resin, a vinyl acetate resin, a polyolefin resin, and copolymers thereof.

3. The photosensitive transfer recording material according to claim 1, wherein the resin of the thermoplastic resin layer includes
    a resin (A) having a weight average molecular weight of 50,000 to 500,000 and a glass transition temperature (Tg) of 0 to 140° C., and
    a resin (B) having a weight average molecular weight of 3,000 to 30,000 and a glass transition temperature (Tg) of 30 to 170° C.

4. The photosensitive transfer recording material according to claim 3, wherein the mixing ratio of resins (A) and (B) is 5 to 95% by weight.

5. The photosensitive transfer recording material according to claim 1, wherein the thickness of the thermoplastic resin layer is 6 to 100 µm.

6. The photosensitive transfer recording material according to claim 1, wherein the alkali-soluble intermediate layer comprises a resin that includes polyvinyl alcohol.

7. The photosensitive transfer recording material according to claim 6, wherein the degree of saponification of the polyvinyl alcohol is 80% or more.

8. The photosensitive transfer recording material according to claim 6, wherein the resin further includes polyvinyl pyrrolidone.

9. The photosensitive transfer recording material according to claim 8, wherein the polyvinyl pyrrolidone/polyvinyl alcohol weight ratio is 1:99 to 75:25.

10. The photosensitive transfer recording material according to claim 1, wherein the thickness of the alkali-soluble intermediate layer is 0.1 to 5 µm.

11. The photosensitive transfer recording material according to claim 1, wherein the polymer latex contains at least one polymer latex made of an acrylic polymer, a vinyl acetate polymer, a styrene-butadiene polymer, a chloroprene polymer, an olefin polymer, a polyester polymer, a polyurethane polymer, a polystyrene polymer, and copolymers thereof.

12. The photosensitive transfer recording material according to claim 1, wherein the glass transition temperature (Tg) of the polymer latex is 60° C. or less.

13. The photosensitive transfer recording material according to claim 1, wherein the intermediate layer comprises resin wherein the amount of the polymer latex is, in terms of the solid content thereof, 5 to 70% by weight with respect to the resin of the intermediate layer.

* * * * *